(12) United States Patent
Liang (10) Patent No.: US 11,030,130 B2
(45) Date of Patent: Jun. 8, 2021

(54) STORAGE DEVICE, ACCESS METHOD AND SYSTEM UTILIZING THE SAME

(71) Applicant: Winbond Electronics Corp., Taichung (TW)

(72) Inventor: Chih-Wei Liang, Fuxing Township, Changhua County (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 16/840,818

(22) Filed: Apr. 6, 2020

(65) Prior Publication Data

US 2021/0049117 A1 Feb. 18, 2021

(30) Foreign Application Priority Data

Aug. 15, 2019 (TW) .................................. 108129079

(51) Int. Cl.
*G06F 3/00* (2006.01)
*G06F 13/16* (2006.01)
*G06F 3/06* (2006.01)
*G11C 11/4096* (2006.01)
*G11C 11/408* (2006.01)

(52) U.S. Cl.
CPC ........ *G06F 13/1668* (2013.01); *G06F 3/0604* (2013.01); *G06F 3/065* (2013.01); *G06F 3/0673* (2013.01); *G11C 11/4085* (2013.01); *G11C 11/4096* (2013.01)

(58) Field of Classification Search
None
See application file for complete search history.

(56) References Cited

U.S. PATENT DOCUMENTS

| 6,115,289 | A | * | 9/2000 | Sin ........................ G11C 16/26 365/185.23 |
| 7,246,215 | B2 | | 7/2007 | Lu et al. |
| 2008/0147962 | A1 | * | 6/2008 | Diggs ................. G06F 11/2094 711/103 |
| 2012/0026815 | A1 | * | 2/2012 | Komatsu ................ G11C 29/24 365/200 |
| 2012/0110244 | A1 | | 5/2012 | Feeley et al. |
| 2014/0181435 | A1 | * | 6/2014 | Privitt ................. G06F 11/2097 711/162 |
| 2016/0364181 | A1 | * | 12/2016 | McGlaughlin et al. ..................... G06F 3/0688 |
| 2017/0371539 | A1 | | 12/2017 | Mai et al. |

* cited by examiner

*Primary Examiner* — Henry Tsai
*Assistant Examiner* — Dean Phan
(74) *Attorney, Agent, or Firm* — Birch, Stewart, Kolasch & Birch, LLP (57) ABSTRACT

A storage device including a memory array and a peripheral logic circuit is provided. The memory array includes a plurality of banks and a data path. The peripheral logic circuit operates in a copy mode or a normal mode according to a mode-switch command. In the copy mode, the peripheral logic circuit directs a first bank to provide specific data to the data path and directs a second bank to receive specific data from the data path.

18 Claims, 4 Drawing Sheets

STORAGE DEVICE, ACCESS METHOD AND SYSTEM UTILIZING THE SAME

CROSS REFERENCE TO RELATED APPLICATIONS

This application claims priority of Taiwan Patent Application No. 108129079, filed on Aug. 15, 2019, the entirety of which is incorporated by reference herein.

BACKGROUND OF THE INVENTION

Field of the Invention

The invention relates to a storage device, and more particularly to a storage device that is capable of copying data from a bank to another bank.

Description of the Related Art

In a conventional access operation, if a memory controller intends to copy data from a first address of a memory to a second address of the memory, the memory controller assigns the first address and then sends a read command to retrieve data of the first address. After the data of the first address has been retrieved by the memory controller, the memory controller assigns the second address and then sends a write command to write the data of the first address to the second address. The conventional access operation however is time consuming.

BRIEF SUMMARY OF THE INVENTION

In accordance with an embodiment, a storage device comprises a memory array and a peripheral logic circuit. The memory array comprises a plurality of banks and a data path. The peripheral logic circuit operates in a copy mode or a normal mode according to a mode-switch command. In the copy mode, the peripheral logic circuit directs a first bank of the plurality of banks to provide specific data to the data path and directs a second bank of the plurality of banks to receive the specific data from the data path.

An exemplary embodiment of an access method for a storage device comprising a plurality of banks is described in the following paragraph. A mode-switch command is received to enter a copy mode or a normal mode. In the copy mode, a first bank of the plurality of banks is directed to provide specific data to a data path and a second bank of the plurality of banks is directed to store the specific data from the data path. In the normal mode, external data is provided to the data path according to a write command, the second bank is directed to store the external data, the first bank is directed to provide the specific data to the data path and the specific data from the data path is output to an external interface.

In one aspect of one implementation of the invention, an access system comprises a controller and a storage device. The controller is configured to generate a mode-switch command. After the controller sends the mode-switch command, the controller generates an activation command and a copy command. The storage device operates according to the mode-switch command, the activation command and the copy command. The storage device comprises a memory array and a peripheral logic circuit. The memory array comprises a plurality of banks and a data path. The data path is coupled to the plurality of banks. The peripheral logic circuit operates in a copy mode or a normal mode according to the mode-switch command. In the copy mode, the peripheral logic circuit directs a first bank of the plurality of banks to provide specific data to the data path and directs a second bank of the plurality of banks to store the specific data from the data path.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
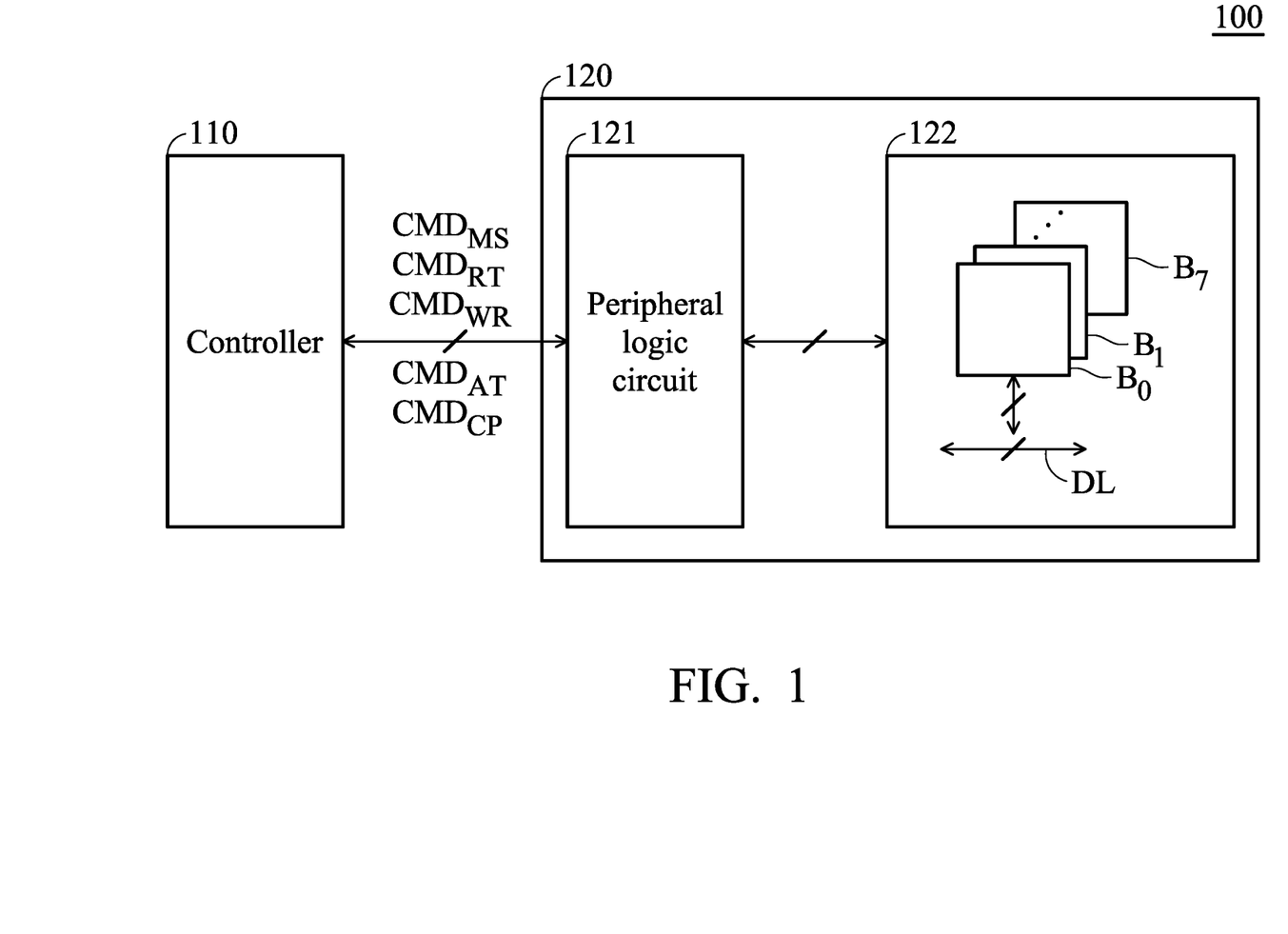
FIG. 1 is a schematic diagram of an exemplary embodiment of an access system according to various aspects of the present disclosure.

FIG. 1 is a schematic diagram of an exemplary embodiment of an access system according to various aspects of the present disclosure. As shown in FIG. 1, the access system 100 comprises a controller 110 and a storage device 120. The controller 110 sends different commands to access the storage device 120. For example, assuming the controller 110 intends to read data stored in the storage device 120. In such case, the controller 110 sends a read command $CMD_{RT}$. If the controller 10 intends to write data into the storage device 120, the controller 110 sends a write command $CMD_{WR}$. If the controller 110 intends to change the operation mode of the storage device 120, the controller 110 sends a mode-switch command $CMD_{MS}$. In this case, the storage device 120 operates in a normal mode or in a copy mode according to the mode-switch command $CMD_{MS}$.

In the normal mode, when the controller 110 sends the read command $CMD_{RT}$, the storage device 120 performs a read operation and provides specific data stored in the storage device 120 to the controller 110. In this mode, when the controller 110 sends the write command $CMD_{WR}$, the storage device 120 performs a write operation to store external data. In the copy mode, the storage device 120 selects a plurality of addresses according to an activation command $CMD_{AT}$ and then copies data from a specific address to another specific address according to a copy command $CMD_{CP}$ sent from the controller 110. The type of copy command $CMD_{CP}$ is not limited in the present disclosure. The copy command $CMD_{CP}$ may be a write command or a read command. In this case, the controller 110 only sends a command (e.g., a write command or a read command) to direct the storage device 120 perform a copy operation.

The kind of storage device 120 is not limited in the present disclosure. In one embodiment, the storage device 120 is a DRAM. In this embodiment, the storage device 120 comprises a peripheral logic circuit 121 and a memory array 122. The peripheral logic circuit 121 decodes the command sent from the controller 110 to generate a decoded result and accesses the memory array 122 according to the decoded result.

The memory array 122 comprises banks $B_0$~$B_7$ and a data path DL. The banks $B_0$~$B_7$ are coupled to the data path DL. The banks $B_0$~$B_7$ may output specific data to the data path DL or receive and store the specific data from the data path DL. In one embodiment, the data path DL is a data bus. Additionally, the number of banks is not limited in the present disclosure. In other embodiments, the memory array 122 may comprise more banks or fewer banks.

In the normal mode, the peripheral logic circuit 121 decodes the commands sent from the controller 110 to determine the type of commands and performs different operations according to the different commands. For example, when the controller 110 sends the read command $CMD_{RT}$, the peripheral logic circuit 121 performs a read operation for the memory array 122. The peripheral logic circuit may direct a specific bank of the memory array 122 to output specific data to the data path DL according to address information of the read command $CMD_{RT}$. Then, the peripheral logic circuit 121 reads the specific data from the data path DL and outputs the specific data to the controller 110.

In the normal mode, when the controller 110 sends the write command $CMD_{WR}$, the peripheral logic circuit 121 performs a write operation for the memory array 122. In this case, the peripheral logic circuit may transmit external data provided by the controller 110 to the data path DL. The peripheral logic circuit 121 directs a specific bank of the memory array 122 to receive and store the specific data from the data path DL according to a write address of the write command $CMD_{WR}$.

In the copy mode, the peripheral logic circuit performs a copy operation for the memory array 122 to copy all or a portion of data stored in a specific bank of the memory array 122 to one or more banks of the memory array 122. For example, when the controller 110 intends to copy data of a first bank of the memory array 122 to a second bank of the memory array 122, the controller 110 sends the mode-switch command $CMD_{MS}$ to direct the peripheral logic circuit 121 enters the copy mode.

In the copy mode, the peripheral logic circuit 121 actives a plurality of banks and serves an active bank as a source bank. Briefly put, assuming the peripheral logic circuit 121 actives the banks $B_0$ and $B_7$ and serves the bank $B_0$ as a source bank. In such cases, the peripheral logic circuit 121 directs the bank $B_0$ to output specific data to the data path DL. Additionally, the peripheral logic circuit 121 serves the bank $B_7$ as a target bank and directs the bank $B_7$ to store the specific data from the data path DL. Since the peripheral logic circuit 121 does not receive the specific data from the data path DL and does not provide external data to the data path DL, the access time is reduced.

The invention is not limited with regard to the number of target bank. In one embodiment, the peripheral logic circuit 121 may direct many target banks (e.g., the banks $B_1$ and $B_7$) to store the specific data from the data path DL. Since the peripheral logic circuit 121 can write the specific data into many banks simultaneously, the write time is reduced.

The invention does not limit how the peripheral logic circuit 121 assigns the source bank and the target bank. In one embodiment, the controller 110 sends an activation command $CMD_{AT}$ to assign which banks to perform a copy operation. In this case, the peripheral logic circuit 121 decodes the activation command $CMD_{AT}$ to generate activation information BNK<7:0> and activates many banks of the memory array 122 according to the activation information BNK<7:0>.

In one embodiment, the activation information BNK<7:0> has a plurality of bits, each corresponding to a bank. For example, when the value of the activation information BNK<7:0> is 1000 0001, it means that the controller 110 selects the banks $B_7$ and $B_0$. Therefore, the peripheral logic circuit 121 activates the banks $B_7$ and $B_0$. In other embodiments, when the value of the activation information BNK<7:0> is 1000 0011, it means that the controller 110 selects the banks $B_7$, $B_1$ and $B_0$. Therefore, the peripheral logic circuit 121 activates the banks $B_7$, $B_1$ and $B_0$.

Next, the peripheral logic circuit 121 decodes a copy command $CMD_{CP}$ sent from the controller 110 to generate source information RCBS<7:0>. The source information RCBS<7:0> is provided to assign one bank among the activated banks as a source bank. In one embodiment, the source information RCBS<7:0> has a plurality of bits, each corresponding to a bank. For example, when the value of the source information RCBS<7:0> is 0000 0001, it means that the controller 110 intends to copy the data stored in the bank $B_0$. Therefore, the peripheral logic circuit 121 assigns the bank $B_0$ to serve as a source bank according to the source information RCBS<7:0>. In this case, the peripheral logic circuit 121 directs the bank $B_0$ to output specific data to the data path DL. In other embodiments, the peripheral logic circuit 121 obtains address information according to the copy command $CMD_{CP}$ and enables a portion of bit lines of the bank $B_0$ according to the address information to direct the enabled bit lines to output data referred to as the specific data.

Then, the peripheral logic circuit 121 performs a specific operation for the activation information BNK<7:0> and the source information RCBS<7:0> to obtain at least one target bank among the activated banks. The type of specific operation is not limited in the present disclosure. In one embodiment, any operation can serve as the specific operation, as long as the operation is capable of identifying a source bank and at least one target bank. In this embodiment, the peripheral logic circuit 121 performs an XOR operation for the activation information BNK<7:0> and the source information RCBS<7:0> to generate write information WCBS<7:0>. In one embodiment, the write information WCBS<7:0> has a plurality of bits each corresponding to a bank.

For example, assuming the value of the write information WCBS<7:0> is 1000 0000 corresponding to the banks $B_7$~$B_0$ respectively. In this case, the bank $B_7$ is assigned to serve a target bank. Therefore, the peripheral logic circuit 121 directs the bank $B_7$ to receive the specific data from the data path DL. In some embodiments, when the value of the write information WCBS<7:0> is 1111 1110, it means that the banks $B_7$~$B_1$ serve as target banks. Therefore, the peripheral logic circuit 121 directs the banks $B_7$~$B_1$ to receive and store the specific data from the data path DL. Since the data stored in a specific bank can be copied to many banks, the data-access efficiency is increased.

Figure 2:
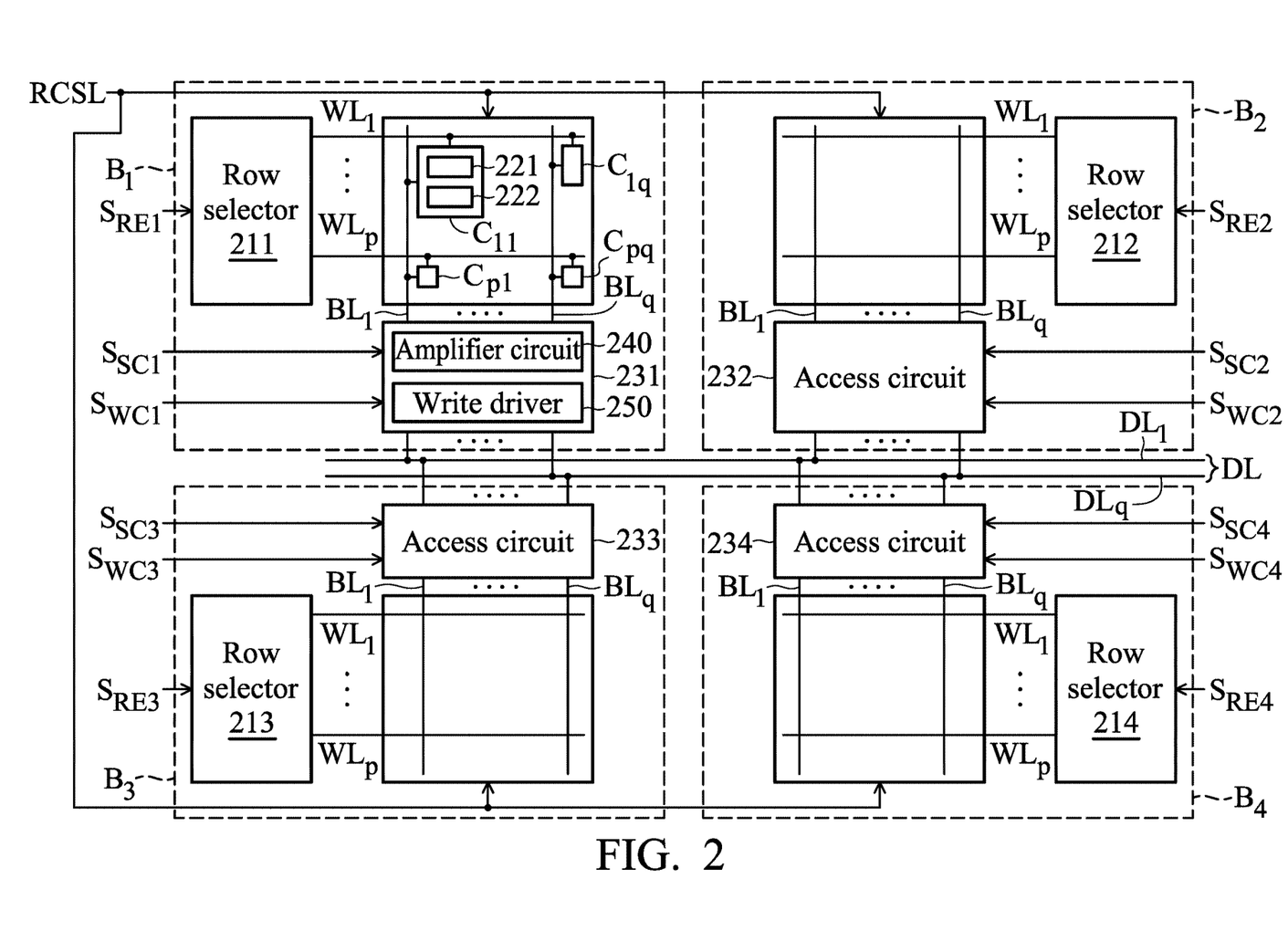
FIG. 2 is a schematic diagram of an exemplary embodiment of a memory array according to various aspects of the present disclosure.

FIG. 2 is a schematic diagram of an exemplary embodiment of the memory array 122 according to various aspects of the present disclosure. Briefly put, only banks $B_1$~$B_4$ are shown in FIG. 2, but the disclosure is not limited thereto. Additionally, the structure of the banks $B_1$~$B_4$ are the same. The bank $B_1$ is used as an example to describe structure and operation. In this embodiment, the bank $B_1$ comprises a row selector 211, cells $C_{11}$~$C_{pq}$ and an access circuit 231.

The row selector 211 is coupled to the word lines $WL_1$~$WL_p$ and selects one of the word lines $WL_1$~$WL_p$ according to a row enable signal $S_{RE1}$. In one embodiment, the row enable signal $S_{RE1}$ relates to the activation information BNK<7:0>. For example, when the value of the first specific bit of the activation information BNK<7:0> is 1, it means that the bank $B_1$ needs to be activated. Therefore, the peripheral logic circuit 121 enables a specific word line of the bank $B_1$ according to the row enable signal $S_{RE1}$. In other embodiments, when the values of a first specific bit and a second specific bit of the activation information BNK<7:0> are 1, it means that the banks $B_1$ and $B_2$ need to be activated. Therefore, the peripheral logic circuit 121 selects a specific word line (e.g., the word line $WL_1$) coupled to the banks $B_1$ and $B_2$ via the row enable signals $S_{RE1}$ and $S_{RE2}$.

In this embodiment, the cells $C_{11} \sim C_{pq}$ are arranged into an array and each cell is coupled to a corresponding word line and a corresponding bit line. For example, the cell $C_{11}$ is coupled to the word line $WL_1$ and the bit line $BL_1$ to receive and store the data from the bit line $BL_1$ according to a turn-on signal from the word line $WL_1$ or output data to the bit line $BL_1$ according to the turn-on signal from the word line $WL_1$. Since the structures of the cells $C_{11} \sim C_{pq}$ are the same, FIG. 2 only shows the structure of the cell $C_{11}$.

As shown in FIG. 2, the cell $C_{11}$ comprises a storage capacitor 221 and an access circuit 222. The access circuit 222 comprises an amplifier circuit (not shown). The amplifier circuit amplifies data stored in the storage capacitor 221 according to a column enable signal RCSL to generate amplified data to the corresponding bit line. In some embodiments, the amplifier circuit in the access circuit 222 is referred to as a first sense amplifier. In other embodiments, the cells (e.g., $C_{11} \sim C_{p1}$) coupled to the same bit line (e.g., $BL_1$) shares the same amplifier circuit. Therefore, the cells $C_{11} \sim C_{pq}$ do not occupy large space in the bank $B_1$.

In one embodiment, the column enable signal RCSL relates to the copy command $CMD_{CP}$. For example, after the peripheral logic circuit 121 decodes the copy command $CMD_{CP}$, the peripheral logic circuit 121 obtains the source information RCBS<7:0> and address information (i.e., the column enable signal RCSL). The address information is utilized to assign the bit line which is coupled to a bank to be read.

The access circuit 231 is coupled to the bit lines $BL_1 \sim BL_q$ and receives the control signals $S_{SC1}$ and $S_{WC1}$. In this embodiment, the access circuit 231 comprises an amplifier circuit 240 and a write driver 250. The amplifier circuit 240 amplifies the data from the bit lines $BL_1 \sim BL_q$ according to the control signal $S_{SC1}$ and provides the amplified data to the data path DL. In one embodiment, the amplifier circuit 240 is referred to as a second sense amplifier (SSA). The write driver 250 transmits the data from the data path DL to at least one of the bit lines $BL_1 \sim BL_q$ according to the control signal $S_{WC1}$.

In one embodiment, the control signal $S_{SC1}$ relates to the source information RCBS<7:0>. For example, assuming the value of a specific bit of the source information RCBS<7:0> is 1 and the specific bit corresponds to the bank $B_1$. In this case, the peripheral logic circuit 121 enables the control signal $S_{SC1}$. Therefore, the amplifier circuit 240 amplifies the data from the bit lines $BL_1 \sim BL_q$ and outputs the amplified data to the data path DL.

In other embodiments, the control signal $S_{WC1}$ is related to the write information WCBS<7:0>. For example, assuming that the value of a specific bit of the write information WCBS<7:0> is 1 and the specific bit corresponds to the bank $B_1$, the peripheral logic circuit 121 enables the control signal $S_{WC1}$. Therefore, the write driver 250 transmits the data on the data path DL to the bank $B_1$.

The data path DL comprises paths $DL_1 \sim DL_q$ configured to receive data from the access circuits 231~234. In one embodiment, the number of paths of the data path DL is the same as the number of bit lines of each bank. In this case, the bit lines $BL_1 \sim BL_q$ of the banks $B_1 \sim B_4$ are coupled to path $DL_1 \sim DL_q$ via the access circuits 231~234 respectively. For example, the bit lines $BL_1$ of the banks $B_1 \sim B_4$ are coupled to the path $DL_1$, and the bit lines $BL_q$ of the banks $B_1 \sim B_4$ are coupled to the path $DL_q$.

Assuming that the bank $B_1$ is assigned to be a source bank, and the bank $B_4$ is assigned to be a target bank. In this case, the row selector 221 selects one of the word lines $WL_1 \sim WL_p$ of the bank $B_1$ according to the row enable signal $S_{RE1}$. Assuming the word line $WL_1$ is selected. In this case, when the column enable signal RCSL enables the bit lines $BL_1 \sim BL_q$, the cells $C_{11} \sim C_{1q}$ of the bank $B_1$, arranged in a first row (horizontally) are turned on. Therefore, each of the access circuits 222 in the cells $C_{11} \sim C_{1q}$ of the bank $B_1$ amplifies data stored in the corresponding storage capacitor 221 to generate amplified data to the corresponding bit line among the bit lines $BL_1 \sim BL_q$. When the control signal $S_{SC1}$ is enabled, the amplifier circuit 240 of the bank $B_1$ amplifies the amplified data of the bit lines $BL_1 \sim BL_q$ to generate specific data to the data path DL. When the control signal $S_{WC4}$ is enabled, the access circuit 234 of the bank $B_4$ transmits data on the data path DL to the bit lines $BL_1 \sim BL_q$ of the bank $B_4$.

Figure 3:
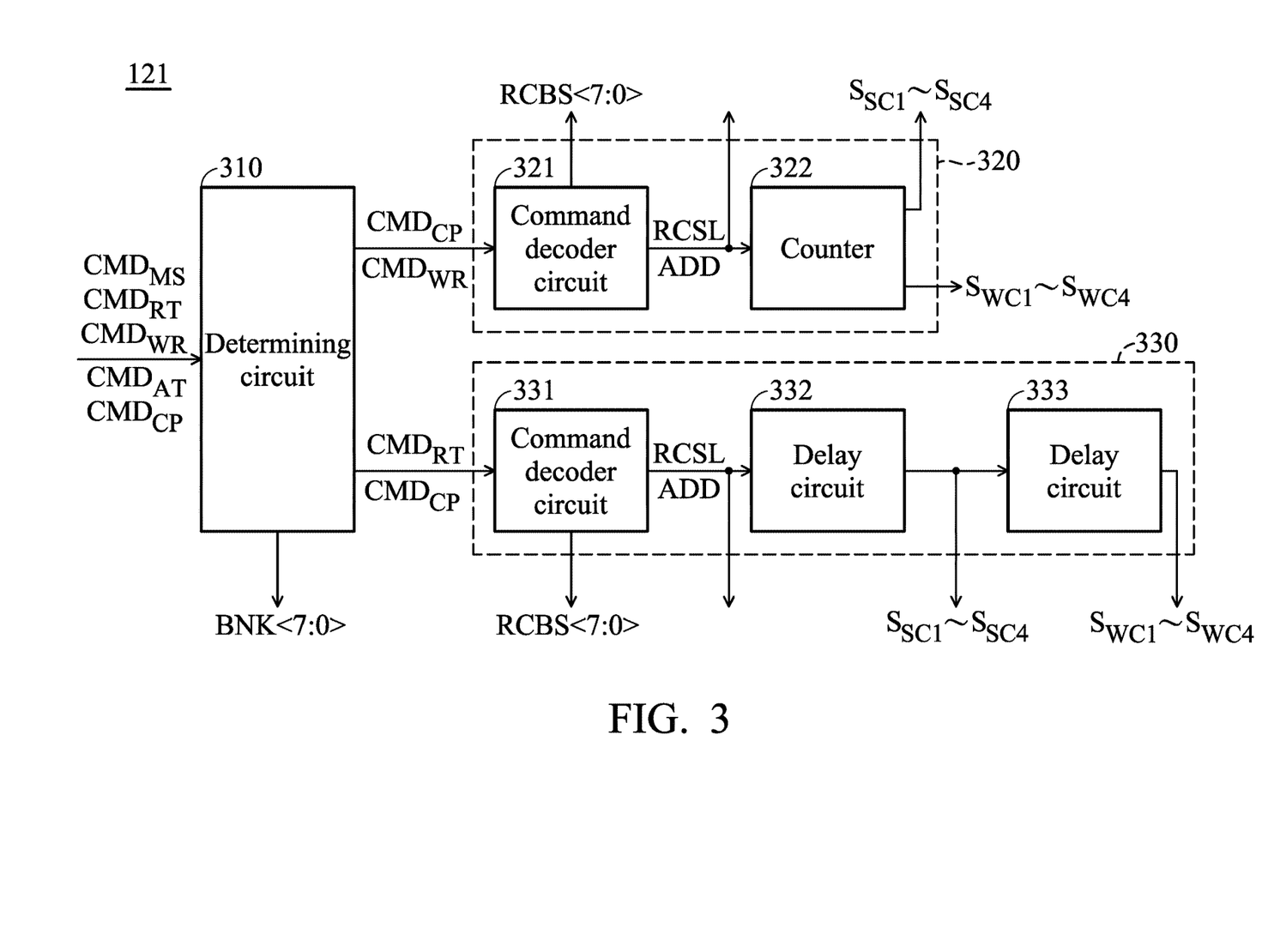
FIG. 3 is a schematic diagram of an exemplary embodiment of a peripheral logic circuit according to various aspects of the present disclosure.

FIG. 3 is a schematic diagram of an exemplary embodiment of the peripheral logic circuit 121 according to various aspects of the present disclosure. In this embodiment, the peripheral logic circuit 121 comprises a determining circuit 310, a write circuit 320 and a read circuit 330. The determining circuit 310 controls the write circuit 320 and the read circuit 330 according to the kind of the command sent from the controller 110. For example, when the controller 110 intends to copy data from a bank of the memory array 122 to another bank of the memory array 122, the controller 110 sends the mode-switch command $CMD_{MS}$ to require the write circuit 320 to enter a copy mode.

In the copy mode, the determining circuit 310 provides a copy command $CMD_{CP}$ sent from the controller 110 to the write circuit 320 or the read circuit 330 according to the kind of copy command $CMD_{CP}$. For example, when the copy command $CMD_{CP}$ is a write command, the determining circuit 310 requires the write circuit 320 to enter a copy mode and provides the copy command $CMD_{CP}$ to the write circuit 320. However, when the copy command $CMD_{CP}$ is a read command, the determining circuit 310 requires the read circuit 330 to enter a copy mode and provides the copy command $CMD_{CP}$ to the read circuit 330.

In other embodiments, the determining circuit 310 decodes the activation command $CMD_{AT}$ to generate and output the activation information BNK<7:0>. In this case, the activation information BNK<7:0> is utilized to activate a plurality of banks. In some embodiments, the determining circuit 310 outputs the activation command $CMD_{AT}$ to the write circuit 320 or the read circuit 330. In this case, the write circuit 320 or the read circuit 330 decodes the activation command $CMD_{AT}$ to generate and output the activation information BNK<7:0>.

In one embodiment, the write circuit 320 comprises a command decoder circuit 321 and a counter 322. In the copy mode, the command decoder circuit 321 decodes the copy command $CMD_{CP}$ to generate source information RCBS<7:0> and the column enable signal RCSL. The source information RCBS<7:0> is utilized to assign a source bank among the activated banks. The column enable signal RCSL is address information to select at least one of the word lines and at least one of the bit lines of the source bank.

The counter 322 is configured to provide the control signals $S_{SC1} \sim S_{SC4}$ and $S_{WC1} \sim S_{WC4}$. In the copy mode, after receiving the column enable signal RCSL, the counter 322 starts counting. When a first count value of the counter 322 reaches a first predetermined value, the counter 322 enables one of the control signals $S_{SC1} \sim S_{SC4}$ to turn on the amplifier function of the corresponding access circuit. Taking FIG. 2 as an example, when the counter 322 enables the control signal $S_{SC1}$, the amplifier circuit 240 of the access circuit 231 amplifies the data stored in the bank $B_1$ to generate amplified data and output the amplified data to the data path DL.

When a second count value of the counter 322 reaches a second predetermined value, the counter 322 enables one of the control signals $S_{WC1} \sim S_{WC4}$ to turn on the write function of the corresponding access circuit. Taking FIG. 2 as an example, when the counter 322 enables the control signal $S_{WC4}$, the write driver (not shown) of the access circuit 234 transmits the specific data on the data path DL to the bank $B_4$.

In other embodiments, the read circuit 330 comprises a command decoder circuit 331 and delay circuits 332 and 333. In the copy mode, the command decoder circuit 331 decodes the copy command $CMD_{CP}$ to generate the source information RCBS<7:0> and the column enable signal RCSL. Since the operation of the command decoder circuit 331 is the same as the operation of the command decoder circuit 321, the description of the operation of the command decoder circuit 331 is omitted.

The delay circuit 332 delays the column enable signal RCSL to enable one of the control signals $S_{SC1} \sim S_{SC4}$. The control signals $S_{SC1} \sim S_{SC4}$ are utilized to turn on the amplifier function of the access circuit of the source bank. The delay circuit 333 delays the control signals $S_{SC1} \sim S_{SC4}$ to generate the control signals $S_{WC1} \sim S_{WC4}$. The control signals $S_{WC1} \sim S_{WC4}$ are utilized to turn on the write function of the access circuit of the target bank.

In other embodiments, the determining circuit 310 may operate in a normal mode according to the mode-switch command $CMD_{MS}$. In the normal mode, the determining circuit 310 enables the write circuit 320 or the read circuit 330. For example, when the determining circuit 310 receives the write command $CMD_{WR}$, the determining circuit 310 enables the write circuit 320 and requires the write circuit 320 to operate in a normal mode. In the normal mode, the command decoder circuit 321 decodes the write command $CMD_{WR}$ to generate address information ADD. The address information ADD is utilized to assign a specific address. When the counter 322 receives the address information ADD, the counter 322 starts counting. When the count value of the counter 322 reaches a predetermined value, the counter 322 outputs the control signals $S_{WC1} \sim S_{WC4}$ to turn on the write function of the access circuits 231~234 shown in FIG. 2. Taking the bank $B_1$ of FIG. 2 as an example, when the write function of the access circuit 231 is turned on, the write driver 250 writes the data (referred to as external data) on the data path DL into the bank $B_1$.

In the normal mode, if the determining circuit 310 receives the read command $CMD_{RT}$, the determining circuit 310 enables the read circuit 330 and requires the read circuit 330 to operate in a normal mode. In the normal mode, the command decoder circuit 331 decodes the read command $CMD_{RT}$ to generate address information ADD. The address information ADD is utilized to assign a specific address. The delay circuit 332 delays the address information ADD to generate the control signals $S_{SC1} \sim S_{SC4}$ to turn on the amplifier functions of the access circuits 231~234 shown in FIG. 2. Taking the bank $B_1$ of FIG. 2 as an example, when the amplifier function of the access circuit 231 is turned on, the amplifier circuit 240 amplifies the data of the specific address and transmits the amplified result to the data path DL.

Figure 4:
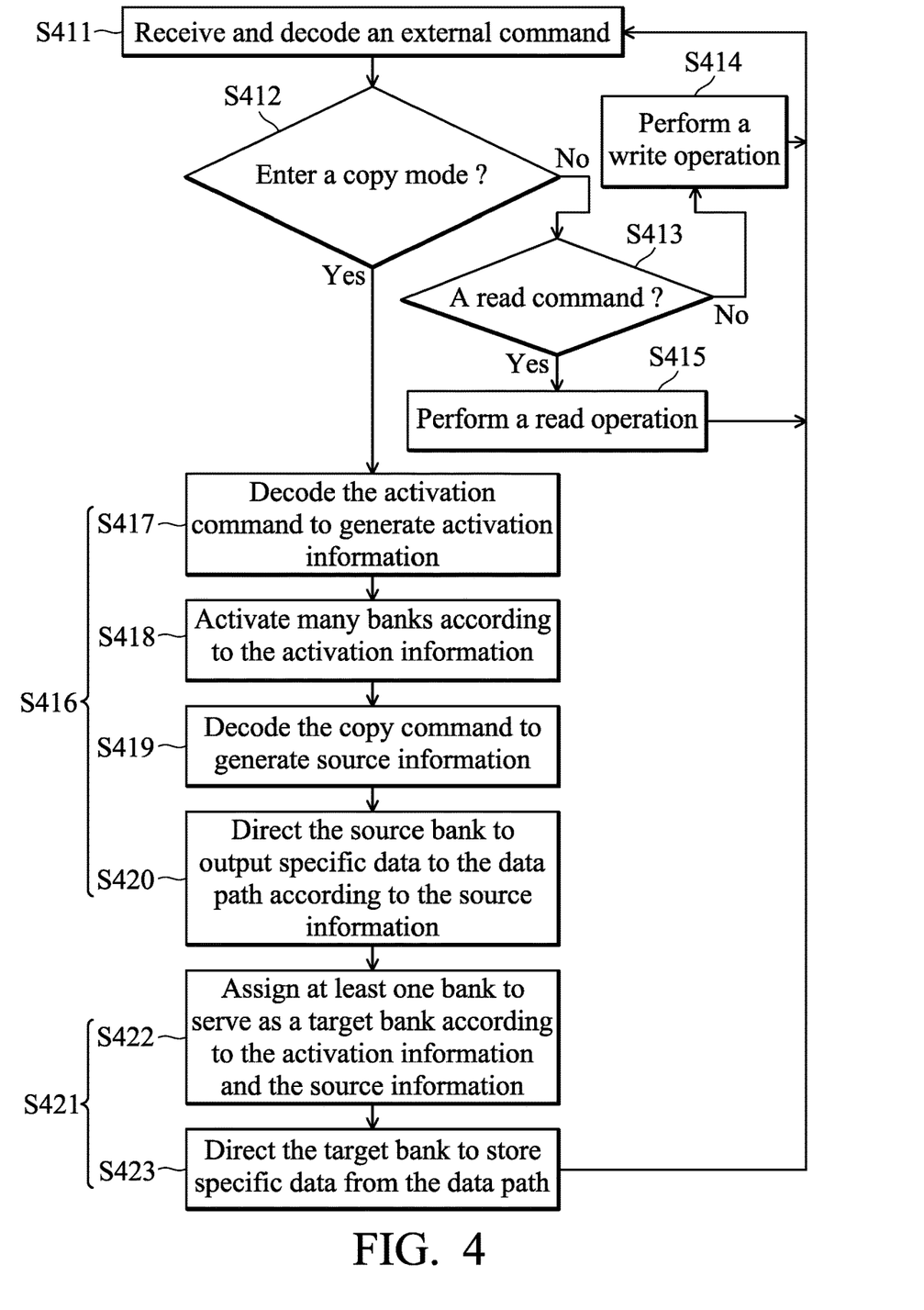
FIG. 4 is a flowchart of an exemplary embodiment of an access method according to various aspects of the present disclosure.

FIG. 4 is a flowchart of an exemplary embodiment of an access method according to various aspects of the present disclosure. The access method is applied to a storage device. In one embodiment, the storage device comprises a plurality of banks. The banks are coupled to a data path.

First, an external command is received and decoded (step S411). In one embodiment, the storage device comprises a peripheral logic circuit configured to decode the external command. The external command may be provided by a controller. In this case, the controller is disposed out of the storage device.

A determination is made as to whether the external command requires the storage device to enter a copy mode (step S412). When the external command does not require the storage device to enter the copy mode, the peripheral logic circuit determines whether the external command is a read command (step S413). When the external command is not a read command, it means that the external command is a write command. Therefore, the peripheral logic circuit performs a write operation to write external data into the corresponding banks (step S414). In one embodiment, the peripheral logic circuit transmits external data provided by an external controller to the data path and directs the corresponding bank to store the external data from the data path.

When the external command is a read command, the peripheral logic circuit performs a read operation to retrieve data stored in a specific bank and outputs the data to an external controller (step S415). In one embodiment, the peripheral logic circuit directs the specific bank to output specific data to the data path. In this case, the peripheral logic circuit retrieves the specific data from the data path and provides the specific data to an external controller.

When the external command directs the storage device to enter a copy mode, a first bank among the banks provides specific data to the data path (step S416). In one embodiment, the external controller sends an activation command. In such cases, the peripheral logic circuit decodes the activation command to generate activation information (step S417). In one embodiment, the activation information has a plurality of bits. Each of the bits of the activation information corresponds to a bank.

Many banks are activated according to the activation information (step S418). For example, when the value of a specific bit of the activation information is 1, it means that the corresponding bank needs to be activated. Therefore, the peripheral logic circuit activates the corresponding bank corresponding to the specific bit. Briefly put, assuming the peripheral logic circuit activates a first bank and a second bank. Additionally, the external controller sends a copy command. In this case, the peripheral logic circuit decodes the copy command to generate source information (step S419).

One of the activated banks outputs specific data to the data path according to the source information (Step S420). In one embodiment, the source information has many bits. Each of the bits of the source information corresponds to a bank. For example, when the value of a specific bit of the source information is 1, it means that the bank corresponding to the specific bit of the source information is a source bank. Therefore, the peripheral logic circuit directs the source bank to output specific data according to the source information. In one embodiment, the peripheral logic circuit further generates address information according to the copy command and enables many bit lines coupled to the source bank according to the address information. In this case, a first sense amplifier coupled to the bit lines amplifies the data stored in the cells coupled to the bit lines to generate amplified data. Next, a second sense amplifier amplifies the amplified data to generate the specific data.

The second bank of the banks is directed to receive the specific data from the data path (step S421). In one embodiment, the peripheral logic circuit assigns at least one of the banks among the activated banks to serve as a target bank according to the activation information and the source information (step S422). In this embodiment, the peripheral logic circuit performs an XOR operation for the activation information and the source information to generate write information.

The peripheral logic circuit directs the target bank to store specific data from the data path according to the write information (step S423). In one embodiment, after the second sense amplifier provides the specific data to the data path, the peripheral logic circuit directs the target bank to store specific data from the data path.

In other embodiments, the peripheral logic circuit may direct many activated banks to simultaneously store the specific data from the data path according to the write information. Therefore, the access time of the storage device can be reduced. Furthermore, since the peripheral logic circuit does not receive external data to be stored in the target bank from an external interface, the process of writing data to the storage device is simplified.

What is claimed is:

1. A storage device comprising:
a memory array comprising:
a plurality of banks; and
a data path; and
a peripheral logic circuit operating in a copy mode or a normal mode according to a mode-switch command,
wherein in the copy mode:
the peripheral logic circuit decodes an activation command to generate activation information and activates a portion of the banks according to the activation information,
the peripheral logic circuit decodes a copy command to generate source information and assigns one among the portion of the banks as a source bank according to the source information,
the peripheral logic circuit performs a specific operation for the activation information and the source information to generate write information and assigns another one of the portion of the banks as a first target bank according to the write information, and
the peripheral logic circuit directs the source bank to output specific data to the data path and directs the target bank to receive and store the specific data from the data path.

2. The storage device as claimed in claim 1,
wherein in the normal mode:
the peripheral logic circuit provides external data to the data path according to a write command and directs the first target bank to store the external data; and
the peripheral logic circuit directs the source bank to provide the specific data to the data path according to a read command and outputs the specific data from the data path to an external interface.

3. The storage device as claimed in claim 1, wherein the specific operation is a XOR operation.

4. The storage device as claimed in claim 1, wherein the peripheral logic circuit further assigns another one of the portion of the banks as a second target bank according to the write information, and directs the second target bank to receive and store the specific data from the data path.

5. The storage device as claimed in claim 1, wherein the memory array comprises:
a first access circuit enabling a plurality of bit lines of the source bank according to a column enable signal and amplifying data stored in a plurality of first cells coupled to the bit lines to generate amplified data;
a second access circuit amplifying the amplified data to generate the specific data according to a first control signal; and
a third access circuit writing the specific data into a plurality of second cells of the first target bank according to a second control signal.

6. The storage device as claimed in claim 4, wherein the peripheral logic circuit comprises:
a command decoder circuit decoding the copy command to generate the column enable signal;
a first delay circuit delaying the column enable signal to generate the first control signal; and
a second delay circuit delaying the first control signal to generate the second control signal.

7. The storage device as claimed in claim 4, wherein the peripheral logic circuit comprises:
a command decoder circuit decoding the copy command to generate the column enable signal; and
a counter having a first count value and a second count value, wherein in response to the first count value reaching a first predetermined value, the counter generates the first control signal, and in response to the second count value reaching a second predetermined value, the counter generates the second control signal.

8. An access method for a storage device comprising a plurality of banks, comprising:
receiving a mode-switch command to operate in a copy mode or a normal mode;
in the copy mode:
decoding an activation command to generate activation information;
activating a portion of the plurality of banks according to the activation information;
decoding a copy command to generate source information;
assigning one of the portion of the plurality of banks as a source bank according to the source information;
performing a specific operation for the activation information and the source information to generate write information;
assigning another one of the portion of the plurality of banks as a first target bank according to the write information;
directing the source bank to provide specific data to a data path; and
directing the first target bank to store the specific data from the data path;
in the normal mode:
providing external data to the data path according to a write command and directing the first target bank to store the external data; and
directing the source bank to provide the specific data to the data path and outputting the specific data from the data path to an external interface.

9. The access method as claimed in claim 8, wherein the specific operation is an XOR operation.

10. The access method as claimed in claim 8, further comprising:
assigning another one of the portion of the plurality of banks as a second target banks according to the write information; and
directing the second target bank to store the specific data from the data path according to the write information.

11. The access method as claimed in claim 10, further comprising:
decoding the copy command to enable a plurality of bit lines of the source bank;
amplifying data stored in a plurality of first cells coupled to the bit lines to generate amplified data;
amplifying the amplified data to generate the specific data; and
directing the first and second target banks to simultaneously store the specific data.

12. The access method as claimed in claim 10, further comprising:
decoding the copy command to enable a plurality of bit lines of the source bank;
amplifying data stored in a plurality of first cells coupled to the bit lines to generate amplified data;
determining whether a first count value reaches a first predetermined value, wherein in response to the first count value reaching the first predetermined value, the amplified data is amplified to generate the specific data; and
determining whether a second count value reaches a second predetermined value, wherein in response to the second count value reaching the second predetermined value, the first and second target banks store the specific data from the data path.

13. An access system comprising:
a controller configured to generate a mode-switch command, wherein after the controller sends the mode-switch command, the controller generates an activation command and a copy command; and
a storage device operating according to the mode-switch command, the activation command and the copy command and comprising:
a memory array comprising:
a plurality of banks; and
a data path coupled to the plurality of banks; and
a peripheral logic circuit operating in a copy mode or a normal mode according to the mode-switch command,
wherein in the copy mode:
the peripheral logic circuit decodes the activation command to generate activation information and activates a portion of the banks according to the activation information,
the peripheral logic circuit decodes the copy command to generate source information and assigns one among the portion of the banks as a source bank according to the source information,
the peripheral logic circuit performs a specific operation for the activation information and the source information to generate write information and assigns another one of the portion of the banks as a first target bank according to the write information, and
the peripheral logic circuit directs the source bank to output specific data to the data path and directs the target bank to receive and store the specific data from the data path.

14. The access system as claimed in claim 13, wherein the memory array comprises:
a first access circuit enabling a plurality of bit lines of the source bank according to a column enable signal and amplifying data stored in a plurality of first cells coupled to the bit lines to generate amplified data;
a second access circuit coupled to the data path and amplifying the amplified data to generate the specific data to the data path according to a first control signal; and
a third access circuit coupled to the data path and transmitting the specific data from the data path to a plurality of second cells of the first target bank according to a second control signal.

15. The access system as claimed in claim 14, wherein the peripheral logic circuit comprises:
a read circuit;
a write circuit; and
a determining circuit providing the copy command to the read circuit or the write circuit according to the copy command.

16. The access system as claimed in claim 15, wherein in response to the copy command being a read command, the determining circuit provides the copy command to the read circuit,
wherein the read circuit comprises:
a command decoder circuit decoding the copy command to generate the column enable signal;
a first delay circuit delaying the column enable signal to generate the first control signal; and
a second delay circuit delaying the first control signal to generate the second control signal.

17. The access system as claimed in claim 16, wherein in response to the copy command being a write command, the determining circuit provides the copy command to the write circuit,
wherein the write circuit comprises:
a command decoder circuit decoding the copy command to generate the column enable signal; and
a counter having a first count value and a second count value, wherein in response to the first count value reaching a first predetermined value, the counter generates the first control signal, and in response to the second count value reaching a second predetermined value, the counter generates the second control signal.

18. The storage device as claimed in claim 1, wherein the peripheral logic circuit comprises:
a command decoder circuit decoding the copy command to generate a column enable signal;
a first delay circuit delaying the column enable signal to generate the first control signal;
a second delay circuit delaying the first control signal to generate the second control signal;
an amplifier circuit amplifying data stored in the source bank according to the first control signal to generate the specific data;
a write driver transmitting the specific data on the data path to the first target bank according to the second control signal.

* * * * *